United States Patent
Minot

(10) Patent No.: US 8,423,331 B2
(45) Date of Patent: Apr. 16, 2013

(54) METHOD FOR OPTIMISATION OF AN AVIONICS PLATFORM

(75) Inventor: Frédéric Minot, Venerque (FR)

(73) Assignee: Airbus Operations SAS, Toulouse (FR)

( * ) Notice: Subject to any disclaimer, the term of this patent is extended or adjusted under 35 U.S.C. 154(b) by 279 days.

(21) Appl. No.: 12/781,276

(22) Filed: May 17, 2010

(65) Prior Publication Data

US 2010/0292969 A1  Nov. 18, 2010

(30) Foreign Application Priority Data

May 18, 2009 (FR) ..................................... 09 53268

(51) Int. Cl.
- *G06F 7/60* (2006.01)
- *G06F 7/00* (2006.01)
- *G06F 15/173* (2006.01)
- *G06F 13/14* (2006.01)
- *G06F 3/00* (2006.01)

(52) U.S. Cl.
USPC .................. 703/2; 701/3; 709/239; 709/238; 710/8; 710/12; 710/305

(58) Field of Classification Search ................ 703/1, 21, 703/2; 701/3
See application file for complete search history.

(56) References Cited

U.S. PATENT DOCUMENTS

| | | | | |
|---|---|---|---|---|
| 5,343,388 A | * | 8/1994 | Wedelin | 705/7.13 |
| 5,778,203 A | * | 7/1998 | Birkedahl et al. | 701/14 |
| 6,002,347 A | * | 12/1999 | Daly et al. | 701/4 |
| 6,047,391 A | * | 4/2000 | Younis et al. | 714/47.1 |
| 6,178,391 B1 | * | 1/2001 | Anderson et al. | 703/1 |
| 7,140,022 B2 | * | 11/2006 | Binns | 718/105 |
| 7,756,145 B2 | * | 7/2010 | Kettering et al. | 709/227 |
| 2002/0144010 A1 | * | 10/2002 | Younis et al. | 709/314 |
| 2005/0065669 A1 | * | 3/2005 | Roux et al. | 701/3 |
| 2005/0265255 A1 | * | 12/2005 | Kodialam et al. | 709/238 |
| 2006/0293805 A1 | * | 12/2006 | Garcia | 701/4 |
| 2007/0127521 A1 | * | 6/2007 | Sandell et al. | 370/466 |
| 2008/0091300 A1 | * | 4/2008 | Fletcher et al. | 700/245 |
| 2008/0217471 A1 | * | 9/2008 | Liu et al. | 700/79 |

(Continued)

FOREIGN PATENT DOCUMENTS

EP 2254066 A1 * 11/2010
WO WO 2010103234 A1 * 9/2010

OTHER PUBLICATIONS

"Constraint-based Design of Avionics Platform—Preliminary Design Exploration" by P. Bieber et al (Dec. 24, 2007, pp. 1-7).*

(Continued)

*Primary Examiner* — Omar Fernandez Rivas
*Assistant Examiner* — Akash Saxena
(74) *Attorney, Agent, or Firm* — Oblon, Spivak, McClelland, Maier & Neustadt, L.L.P.

(57) ABSTRACT

A method for optimization of the avionics platform of an aircraft, intended to implement a set of avionics functions. The association between the platform's functional architecture elements (functions, functional links) and the elements of its equipment architecture (equipment, network paths, direct physical links) are formalized by sets of constraints in the form of linear inequalities of decision variables. Certain segregation or co-location functional constraints are also envisaged. Optimization of the avionics platform is achieved through the minimization of cost functions which are linearly dependent on said decision variables. This minimization under constraints is achieved in an effective manner by the Simplex algorithm.

12 Claims, 4 Drawing Sheets

U.S. PATENT DOCUMENTS

| | | | |
|---|---|---|---|
| 2009/0228223 A1* | 9/2009 | Liu et al. | 702/59 |
| 2009/0254405 A1* | 10/2009 | Hollis | 705/9 |
| 2010/0153684 A1* | 6/2010 | Girlich | 712/29 |
| 2010/0306435 A1* | 12/2010 | Nigoghosian et al. | 710/104 |
| 2012/0084525 A1* | 4/2012 | Jegu et al. | 711/163 |

OTHER PUBLICATIONS

"An Efficient Experimental Methodology for Configuring Search-Based Design Algorithms" by Simon Poulding et al (IEEE 2007, pp. 53-62)—Provided in applicant's IDS dated Sep. 9, 2010.*

Arshad Jhumka et al., "A Dependability-Driven System-Level Design Approach for Embedded Systems", Proceedings of the Design, Automation and Test in Europe Conference and Exhibition, Dec. 31, 2005, XP 040015556, pp. 1-6.

Simon Poulding et al., "An Efficient Experimental Methodology for Configuring Search-Based Design Algorithms", $10^{th}$ IEEE High Assurance Systems Engineering Symposium, Nov. 1, 2007, XP 031191526, pp. 53-62.

Giuseppe Montano et al., "Human Involvement in Dynamic Reconfiguration of Integrated Modular Avionics", $27^{th}$ IEEE Digital Avionics Systems Conference, Oct. 26, 2008, XP 031372602, pp. 4.A.2-1-4.A.2-13.

Laurent Sagaspe et al., "Constraint-Based Design and Allocastion of Shared Avionics Resources", $26^{th}$ IEEE Digital Avionics Systems Conference, Oct. 1, 2007, XP 031166293, pp. 2.A.5-1-2.A.5-10.

U.S. Appl. No. 12/781,273, filed May 17, 2010.

U.S. Appl. No. 12/837,802, filed Jul. 16, 2010.

* cited by examiner

METHOD FOR OPTIMISATION OF AN AVIONICS PLATFORM

TECHNICAL FIELD

This invention relates in a general manner to avionics platforms and more precisely to those manufactured according to an integrated modular architecture, called IMA (Integrated Modular Avionics).

THE STATE OF THE PRIOR ART

The manufacture of an avionics platform, that is to say, the set of onboard means of calculation and communication used to carry out the functions of an aircraft conventionally rely on the use of dedicated computers and communications buses. In such a platform each aircraft function, hereafter called avionics function, is implemented using computers which have an architecture and inputs-outputs which are specific for the undertaking of the function. This involves manufacturing, certifying and maintaining a large number of components or LRUs (Line Replaceable Units), each time a new type of equipment has to be designed.

In order to remedy this source of complexity and of cost, new generation avionics platforms use, as far as is possible, integrated modular architecture (IMA). With this type of architecture, the avionics functions are implemented in shared resources, in practice in the form of software modules hosted by generic computers, and using non-dedicated means of communications. Such platforms offer numerous advantages in terms of reductions in the quantity of computers, of the number of different types of computers, of the number of cables etc., which is eventually expressed as a more favourable final mass and as major savings in terms of maintenance equipment and stock management.

However, whereas conventional avionics platforms were manufactured in an empirical manner, using rules based on experience and involving numerous backwards and forwards loops between the design phase and validation phase, new generation platforms require a completely different approach, both because of their complexity and because of the sharing of resources between avionics functions which is inherent in the IMA architecture. For example, whereas previously concomitant material failures were avoided by using dedicated calculation and communications resources, IMA architecture does not intrinsically guarantee this degree of robustness. It is therefore necessary to distribute the software modules judiciously between the generic computers and to check that the means of a communications allow the exchanges between these modules to be carried out. What is more, the optimisation, on the one hand, of the distribution of the software modules between the various computers, and on the other hand, optimisation of the routing of the functional links which carry out the exchanges between these software modules, whilst observing a certain number of predetermined constraints, involves a high degree of combinatorial complexity. When the avionics platform involves a large number of computers and communications network nodes, optimisation of the platform can no longer be undertaken using brute force type of algorithms. Furthermore, the solution chosen does not in general fulfil some of the implementation criteria, such as that for minimising the number and lengths of routing paths in the platform communications network(s).

Consequently the objective of this invention is to offer a method for optimising the avionics platform architecture, in particular the distribution of the software modules and routing of the functional links between these modules, by optimising certain criteria, whilst complying with a number of implementation constraints.

PRESENTATION OF THE INVENTION

This invention is defined by a method for optimising an aircraft's avionics platform designed to implement a set of avionics functions, where each avionics function is associated with one or more instances of software modules, where any two instances of software modules can exchange messages using a link, called the functional link instance, where said avionics platform in addition includes equipment linked together by unidirectional or bi-directional physical links which belong to different types of networks, paths which allow said equipment to be linked where each path is made up of either a single direct physical link between source equipment and destination equipment, or of a first physical link between said source equipment and a first network node, a second physical link between said destination equipment and a second network node and a network path between said first and second nodes. According to said method, on the one hand instances of functional links are associated with paths intended to implement these instances, using a first set of constraints, and on the other hand instances of software modules are associated with equipment intended to host these instances, by means of a second set of constraints, where said constraints in the first and second sets are formulated as linear inequalities of decision variables, and multiple cost functions formulated as linear combinations of at least some of said decision variables are minimised in order to obtain an optimum implementation solution for the platform.

One or more power sources can also be associated with each item of equipment by means of the second set of constraints.

Advantageously, prior to minimisation of the cost functions, a third set of constraints is envisaged, formulated as linear inequalities of decision variables, allowing instances of functional links to be co-located or segregated by means of sets of network paths that are, respectively, identical and disjoint.

The third set of constraints may for example enable instances of software modules to be co-located or segregated, using sets of equipment that are, respectively, identical and disjoint.

The third set of constraints may also be used to force instances of software modules to be hosted by equipment that is supplied either by the same or by separate power sources.

Furthermore, prior to minimisation of the cost functions, a fourth set of constraints may also be envisaged, formulated as linear inequalities of decision variables, which can be used to ensure beforehand that an instance of a functional link passes through a given network path, or to ensure that an instance of a software module is hosted by a given item of equipment.

According to a first alternative, the cost functions are minimised conjointly over a set of possible values of said decision variables.

According to a second alternative, the cost functions are minimised successively, with a first cost function being minimised over the set of possible values of said decision variables and where each of the other cost functions are minimised over the sub-set of said values obtained by the previous cost function minimisation.

In the case where at least one cost function includes an additional decision variable which is not involved in the entire set of constraints in the first, second, third or fourth sets of constraints, a fifth set of constraints in the form of an inequality which is linearly dependent on at least said additional decision variable may be envisaged.

Advantageously, said cost functions belong to the following list:
- number of items of equipment connected to several communications networks;
- weighted combination of the numbers of communication nodes of various types;
- maximum number of communication node connections;
- sum of the real distances between the items of equipment and the communications nodes to which they are connected;
- number of power sources supplying the various items of equipment:
- sum of the maximum levels of utilisation of equipment resources by the software module instances;
- number of paths associated with a given functional link;
- topological length of network paths associated with a given functional link;
- number of communication nodes common to the network paths associated with a given functional link;
- total number of communication nodes used by the network paths associated with a given functional link.

BRIEF DESCRIPTION OF THE DRAWINGS

Other characteristics and advantages of the invention will become apparent on reading the preferential embodiments of the invention whilst referring to the attached figures, which include.

DETAILED DESCRIPTION OF SPECIFIC EMBODIMENTS

Figure 1:
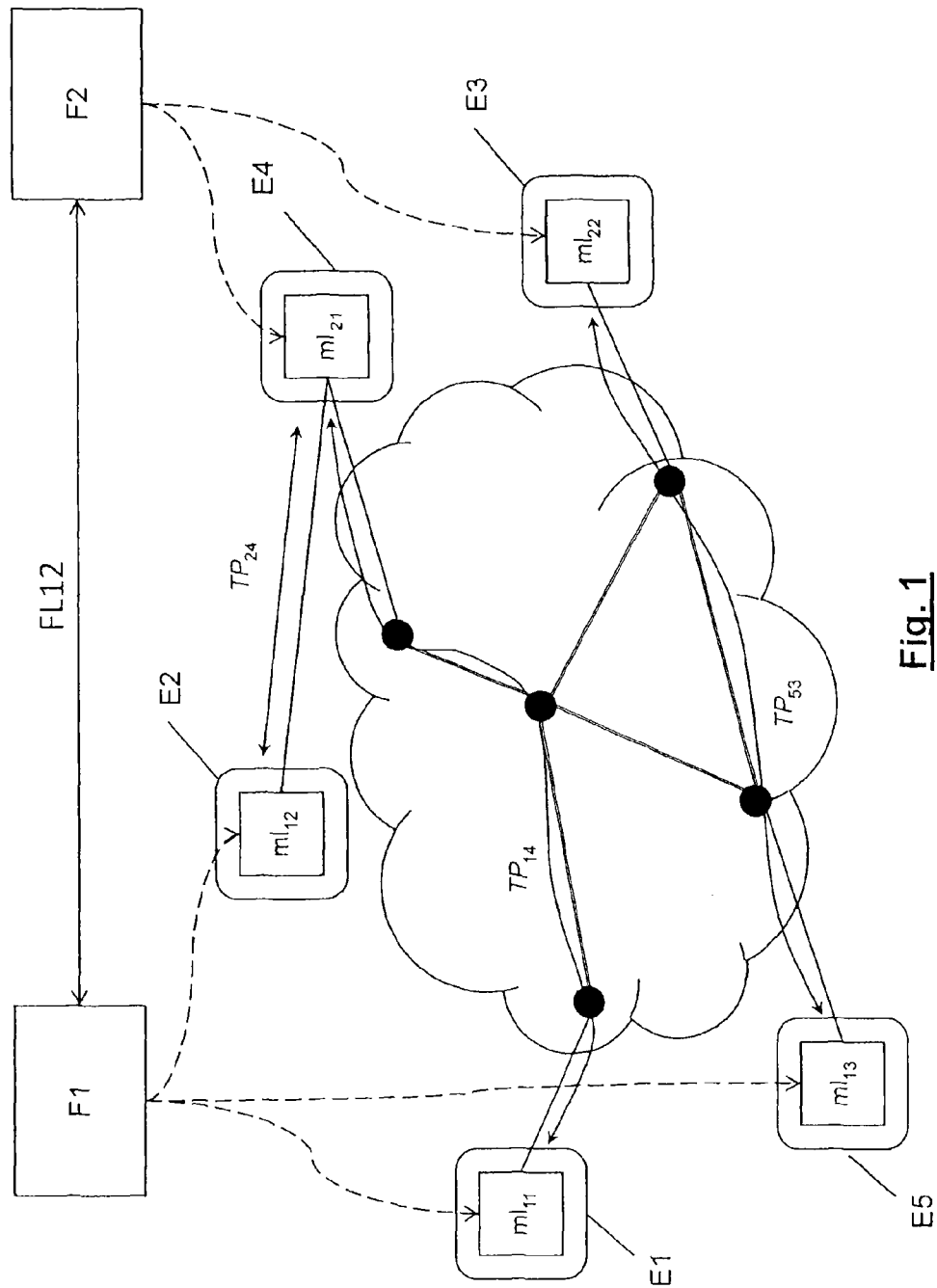
FIG. 1 is a schematic representation of the principle of implementation of avionics functions and of the functional links in an avionics platform.

We will consider below an avionics platform to be manufactured according to an integrated modular architecture, as defined above. This platform is designed to implement a set of predetermined avionics functions. By way of examples, these functions may be roll control, measurement of the amount of fuel etc.

In general, multiple software modules are associated with each of these avionics functions, where the software modules are designed to be hosted in generic on-board computers, and where each software module plays a part in carrying out the function. Certain functions may be duplicated for safety reasons. The software modules of duplicated functions are not necessarily identical. For example, two such software modules may be associated with a command channel (COM) and a monitoring channel (MON) of a flight control system and may use different algorithms to carry out the same function.

Software modules associated with the different avionics functions may exchange messages between each other via links, called functional link instances. For example, a software module which carries out the roll control function may send an alarm message to a software module responsible for the display function.

The avionics platform may be represented in functional terms or in terms of equipment. In its functional representation, the platform includes a certain number of functions, with each function being associated with multiple software modules designed to be hosted by the aircraft equipment, where said software modules may exchange messages by means of functional links (more precisely instances of functional links, as will be seen later).

The equipment structure of the avionics platform may be represented by equipment-type objects. In concrete terms, equipment is a class made up of equipment elements such as computers, sensors, actuators, commutators, routers, gateways etc.

In concrete terms, the equipment elements of the platform are instances of the above mentioned objects. They may be linked together by physical links. Amongst instances of equipment are communications nodes and terminals. Here any instances of equipment that can transmit or be the destination of a message on an instance of a functional link is called a terminal. An instance of transmission (or destination) equipment for a message is called a source terminal (or, respectively, a destination terminal).

Instances of equipment may be linked to each other by uni-directional or bi-directional physical links. A source terminal and a destination terminal may be linked either directly using such a physical link or indirectly using a first physical link between the source terminal and a first communication node, a second physical link between a second communication node and the destination terminal and a path, called a network path, which passes through one or more networks to link the first communication node and the second communication node, where said path includes at least one physical link. In both cases, the set of physical links used to link the two terminals is called the topological path. In other words, in the first case the topological path, referred to as direct, is made up of a single physical link and in the second case the topological path, referred to as indirect, includes a minimum of three of these, of which at least one is between two communication nodes.

FIG. 1 schematically shows the placement of the software modules $ml_{11}$, $ml_{12}$, $ml_{12}$ on one side and $ml_{21}$, $ml_{22}$ on the other side, respectively associated with two functions F1 and F2, on multiple terminals E1 to E5. The functions F1 and F2 are linked by a functional link FL12. This functional link is expressed in terms of equipment as topological links $TP_{24}$, $TP_{14}$, $TP_{52}$ which respectively link the software modules $ml_{12}$ and $ml_{21}$, $ml_{11}$ and $ml_{21}$, $ml_{12}$ and $ml_{22}$.

The problem of optimisation of an avionics platform, for a set of given functions and therefore for a set of software functions which are associated with them (where each function may be associated with one or more software modules) involves, on the one hand, assigning to each of these modules a terminal in which it is to be hosted, and on the other hand involves determining the topological paths which implement the functional links between these terminals, so that a set of criteria is optimised. These optimisation criteria are described in more detail later. As examples, one can however at this point cite minimisation of the number of terminals connected to several communications nodes, minimisation of the maximum number of connections (to physical links) allowed per terminal, minimisation of the actual lengths of links between terminals and the communication nodes to which they are connected, minimisation of the number of direct topological paths between terminals, minimisation of topological lengths (number of communications nodes) of indirect topological paths, minimisation of the maximum calculation load per terminal etc. It is to be understood that the set of optimisation criteria may vary, depending on the type of platform that one wishes to create.

Furthermore, the location of the software modules and routing of topological paths must in general satisfy certain constraints which are described later. One can identify functional constraints and non-functional constraints. The purpose of non-functional constraints is generally to model the association between the elements of the functional structure of the platform and the elements of its equipment structure, for example the association between software modules and the terminals which host them. The functional constraints are induced by the elements of the functional structure, for example, segregation/co-location of topological paths associated with a given functional link, or the segregation/co-location of terminals which host certain software modules. The objective of the various segregation functional constraints is to ensure a high degree of robustness for the various functions in the event of a failure that could affect such and such an element of the platform. Conversely the purpose of the co-location functional constraints is to share certain material resources of the platform and to produce straight failures. The term straight failure refers to a breakdown with well-established effects.

It will be understood that a systematic sweep of all possible combinations of instances of equipment, topological paths, physical links etc. would be cripplingly complex, and would not necessarily guarantee that the constraints are met and criteria optimised.

The basic idea of the invention is to express the aforementioned constraints in the form of linear inequalities and optimisation criteria as linear expressions of decision variables. Linear inequalities also include the special case of a linear equation.

As will be seen later, cost function minimisation may be achieved either conjointly or successively. In the fist case, a composite cost function, obtained as a linear combination of said cost functions using weighting coefficients, can be used. The values of these coefficients reflect the respective importance of the criteria in seeking out the optimum solution.

The set of linear inequalities define a convex, more precisely a polytope in a space of dimension N where N is the number of decision variables. The problem of optimisation may then also be resolved using the simplex algorithm. It will be recalled that the simplex algorithm can be used to solve a problem of the type:

$$\mathrm{Argmin}_x(b^T x) \text{ where } AX \geq c \text{ and } x \geq 0 \quad (1)$$

where $b^T$ is the vector which represents a linear form (cost function), x is the vector representing decision variables (positives), A represents the matrix of constraints and c is a constant vector.

Some constraints cannot be naturally expressed in a linear manner, but in a logic form. It is then necessary to use linearization theorems as described in the appendix. These will be referred to during the description of the constraints.

The formulation of the constraints uses the following constants:

nrjTab: set of power sources present on the avionics platform;
sideTab: set of sides of the aircraft, consequently left-hand side and right-hand side;
neoTab: set of communication nodes. It will be recalled that a communication node is a specific instance of an item of equipment. Each neo element in this set is defined by the following attributes:
    ne: reference to the equipment (element of neTab) for which neo is an instance;
    symId: reference to the element of neoTab linked to neo through a symmetry relationship (see below);
    symMirId: reference to the element of neoTab linked to neo through a path symmetry relationship (see below);
    dupId: reference to the element of mirEoTab linked to neo by a duplication relationship;
    conLevel: level of connection of neos (see below);
    conNb: number of connection resources already used to link neo to other communication nodes;
    side: side of the aircraft to which neo is attached;
    njrs: list of power sources supplying neo.
neTab: set of equipment for which at least one of the instances belongs to neoTab;
pathTab: set of authorised network paths. A path p in this set is defined by an ordered list of elements of the neoTab set. The following constants are introduced:
    pathEoFirst[p, neo] which takes a value 1 if neo is the first communication node of p, and a value 0 otherwise;
    pathEoLast[p, neo] which takes the value 1 if neo is the last communication node of p, and a value 0 otherwise;
    pathEo[p, neo] which takes a value 1 if neo∈p and a value of 0 otherwise.
ceoTab: set of equipment instances which are not communication nodes, that is, which are terminals. Each ceo element in this set is defined by the following attributes:
    ce: reference of the equipment (element of ceTab) for which ceo is an instance;
    symId: reference of the element of ceoTab linked to ceo by a symmetry relationship (see below);
    side: side of the aircraft to which ceo is attached;
ceTab: set of equipment for which at least one instance belongs to ceoTab; Each element ce in this set possesses the following attributes:
    ceos: set of references to elements of ceoTab which represent the instances of the element ce;
    cpuQtt: calculation power resource associated with each instance of ce;
    ramQtt: RAM size resource associated with each instance of ce;
    romQtt: ROM size resource associated with each instance of ce;
    nvmeQtt: Non-volatile memory or NVME (hard disk) size resource associated with each instance of ce;
    In more general terms, a constant resTypeTab is introduced which gives all types of equipment resources associated with an equipment instance, for example CPU, RAM, ROM, NVME etc. In this case attributes restTypeQtt[resType] which indicate the quantity of equipment resource of type resType associated with each instance of ce for each type resType belonging to resTypeTab, can be made to correspond with each element ce of ceTab.
foTab: set of instances of software modules. Each fo element in this set is defined by the following attributes:
    f: reference to the software module (element of fTab) of which fo is an instance;
    cpuCost: quantity of processors necessary for the software module fo;
    ramCost: quantity of RAM necessary for the software module fo;
    romCost: quantity of ROM necessary for the software module fo;
    nvmeCost: hard disk space necessary for the software module fo;
    cpuRes: set of references to equipment (terminals) in ceoTab authorised to host the software module fo;

netRes: set of references to the elements of neoTab to which a terminal which is hosting fo is authorised to be linked by a physical link.

In a similar way to ceTab, a list of restTypeCost[resType] attributes can be introduced which indicate, for each type of resType resource belonging to resTypeTab, the quantity of equipment resource of type resType required for the software module fo.

fTab: set of "software module" classes of which at least one is an instance belonging to foTab; Each element f in this set is defined by an attribute fos which gives a list of references to the software modules (elements of foTab) which are instances of f;

froTab: set of instances of functional links. Each fro element in this set is defined by the following attributes:
  fr: reference to functional link (element of frTab) of which fro is an instance;
  fromFo: reference to the element fo of foTab which represents the instance of transmitting software module of fro;
  toFo: reference to the element fo of foTab which represents the instance of destination software module of fro;
frTab: set of classes of functional links of which at least one instance belongs to foTab. Each element fr in this set is defined by the following attributes:
  fros: set of references to elements of froTab which are instances of fr;
  txNetRes: set of references to elements of neoTab which represent communication nodes allowed to be used first by any path p of pathTab implementing an instance of the functional link fr:
  rxNetRes: set of references to elements of neoTab which represent communication nodes allowed to be used last by any path p of pathTab implementing an instance of the functional link fr.

Given these first definitions, we will successively envisage the association of instances of functional links with topological paths and the placement of instances of software modules in the terminals.

Association of Topological Paths with Functional Links:

At least one topological path is associated with each functional link instance. This topological path may be direct or indirect, as indicated above.

The indirect paths will be considered below. An indirect path is made up of a network path (element of pathTab), of a first physical link between the instance of the source equipment and a first network node and a second physical link between the instance of destination equipment and a second network node.

The choice of first and second physical links is respectively guided by the instance of the source software module and the instance of the destination software module of the instance of the functional link.

Let a software module instance be fo. This software module is linked to other software modules by functional link instances fro. A set of communication nodes neofo is associated with fo, such that:
  the paths associated with the functional link instances fro transmitted by fo pass first through one of the elements of neofo;
  the paths associated with the functional link instances fro received by fo pass last through one of the elements of neofo;
  any instance of equipment ceo which hosts fo is connected to all communication nodes neo belonging to neofo.

A constellation of communication nodes and therefore of physical links is thus obtained for each possible occurrence of hosting of fo by a terminal ceo.

In order to express this association in the form of constraints, the following decision variables are introduced:
  foCon[fo, neo] which is equal to 1 if the element fo of foTab is associated with the element neo of neoTab, and 0 otherwise;
  ceoCon[ceo, neo] which is equal to 1 if the element ceo of ceoTab is connected to the element neo of neoTab;
  ceoConFo[ceo, neo, fo] intermediate variable allowing foCon and foMap (see below) to be linked to ceoCon.
and the following constraints are imposed:

Constraint 1:

$$\forall fo \in foTab, \forall neo \in neoTab \text{ such that } ceo \notin fo.netRes,$$
$$foCon[fo,neo]=0 \quad (2)$$

Constraint 2:
$\forall fo \in foTab, \forall neo \in neoTab$ constraint (iv) is applied (see appendix Theorem III) where:

$$d_1 = \sum_{\substack{fro \in Ffrom \\ p \in Pfirst}} froPath[fro, p] + \sum_{\substack{fro \in Fto \\ p \in Plast}} froPath[fro, p]. \quad (3\text{-}1)$$

where:
Ffrom={fro∈froTab|fro.fromFo=fo},
Fto={fro∈froTab|fro.toFo=fo},
Pfirst={p∈pathTab|first(p)=neo}, Plast={p∈pathTab|last(p)=neo},
froPath[fro.p] is a decision variable described below which is equal to 1 if the element fro of froTab is associated with the element p of pathTab, and 0 otherwise $$\text{and where } d_2 = foCon[fo,neo] \quad (3\text{-}2)$$

$$\text{and } \max(d_1) = 2 \times Card(froTab) \times Card(pathTab) + 1 \quad (3\text{-}3)$$

Constraint 3:
$\forall fo \in foTab, \forall neo \in neoTab, \forall ceo \in ceoTab$ constraint (vii) is applied (see Appendix, Theorem IV) where:

$$d_1 = foMap[fo,ceo] \quad (4\text{-}1)$$

$$d_2 = foCon[fo,neo] \quad (4\text{-}2)$$

$$d_3 = ceoConfo[ceo,neo,fo] \quad (4\text{-}3)$$

Constraint 4:
$\forall neo \in neoTab, \forall ceo \in ceoTab$, constraint (iv) is applied (see Appendix, Theorem II), where:

$$d_1 = \sum_{fo \in foTab} ceoConFo[ceo, neo, fo] \quad (5\text{-}1)$$

$$d_2 = ceoCon[ceo,neo] \quad (5\text{-}2)$$

$$\text{and } \max(d_1) = Card(foTab) + 1 \quad (5\text{-}3)$$

With the possible physical links between terminals and communication nodes having been listed, one seeks to associate at least one network path to each instance of functional link. Thus the instance of a functional link may be implemented by means of a topological path which includes this network path and the aforementioned physical links.

Possible networks paths are sought in the following manner:

A network path p of pathTab can be associated with each functional link instance fro if:
- the first communication node of p, referred to as txNeo, is in both fro.fr.txNetRes and fro.fromFo.netRes;
- the last communication node of p, referred to as rxNeo, is in both fro.fr.rxNetRes and fro.toFo.netRes;

In order to express this association of a network path with a functional link instance, the following decision variables are introduced:
- froPath[fro.p] which is equal to 1 if the element fro of froTab is associated with the element p of pathTab, and 0 otherwise;

and in order to distinguish the association of the functional link instance with a direct or indirect path:
- froDirect[fro] which is equal to 1 if the element fro of froTab is associated with a direct topological path, and 0 otherwise;

Thus the following constraints are imposed in order to express the association in question:

Constraint 5:

$$\forall\, fro \in froTab, \quad \sum_{\substack{p \in pathTab \\ txNeo \in Tfro \\ rxNeo \in Rto}} froPath[fro, p] \times pathEofirst[p, txNeo] \times pathEoLast[p, rxNeo] + froDirect[fro] \geq 1 \quad (6)$$

where $$Tfro = fro.fromFo.netRes \cap fro.fr.txNetRes$$

and $$Rto = fro.toFo.netRes \cap fro.fr.rxNetRes$$

Constraint 6:

$$\forall\, fro \in froTab \quad \sum_{\substack{p \in pathTab \\ p \in \overline{Tfro} \cup \overline{Rto}}} froPath[fro, p] = 0 \quad (7)$$

where $$\overline{Tfro} = \overline{fro.fromFo.netRes} \cup \overline{fro.fr.txNetRes}$$

and $$\overline{Rto} = \overline{fro.toFo.netRes} \cup \overline{fro.fr.rxNetRes}$$

$\overline{A}$ is the complementary set of A.

In order to simplify the search for network paths, it is advantageous to take advantage of certain symmetry relationships within the avionics platform.

A first case of symmetry is that where a network is duplicated, and in more general terms replicated a certain number of times, in order to provide certain transmissions with a greater degree of robustness in the event of a failure in a network node. For example, a source terminal and a destination terminal can each be part of two AFDX networks with the same structure. For each node of network A corresponds in a bi-unique manner a node of network B, called the duplicated node. Similarly, for each path in network A passing through multiple network nodes is associated in a bi-unique manner a path in network B passing through corresponding duplicated nodes. The source terminal connected to the two networks sends a message in the form of two identical frames to the destination terminal. The latter retains the first frame that reaches it and eliminates the same frame that reaches it second.

Figure 2:
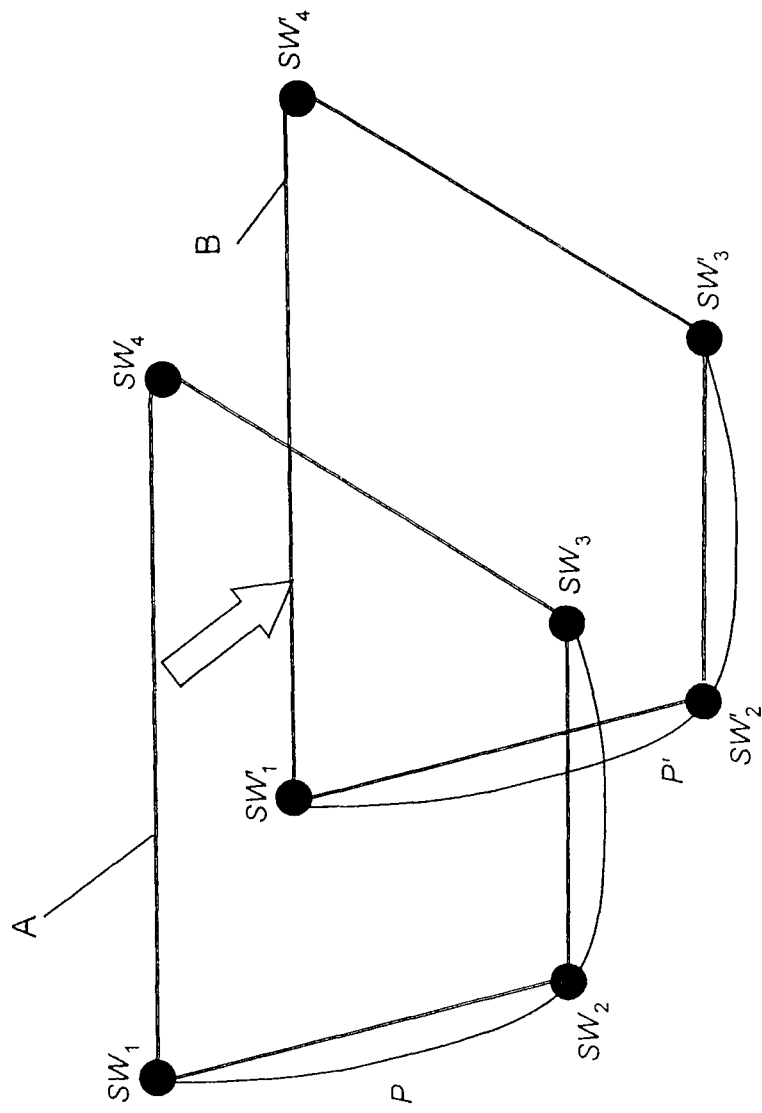
FIG. 2 is a schematic representation of network nodes linked by a duplication relationship.

FIG. 2 represents two AFDX networks, A and B, associated by a duplication relationship. Switches (commutation nodes) $SW'_1$ to $SW'_4$ are obtained by duplication of switches $SW_1$ to $SW_4$. In the same manner, the duplicated network path P' passing through the network nodes $SW'_1$, $SW'_2$, $SW'_2$ corresponds to the network path P passing through nodes $SW_1$, $SW_2$, $SW_2$.

The following constant is introduced in order to model this duplication relationship:

mirEoTab: set of nodes obtained by duplication of nodes belonging to the set neoTab. A node meo of mirEoTab is defined by the attributes:
- neo: reference to the node of neoTab which has been duplicated;
- side: side of the aircraft to which meo is attached;
- nrjs: list of power sources which can supply meo.

The search for paths is simplified in the sense that the communication nodes obtained by a duplication operation are not taken into consideration for the association with a functional link instance. It is in effect considered that if a network path is associated with such an instance, the duplicated network path is also associated with this instance.

In what follows a node which has been the subject of at least one duplication in the above sense will be designated a multiple-type node.

A second case of symmetry involves a pair of network nodes. Two nodes are referred to as symmetrical if, for every path associated with a functional link which passes through one of these nodes, there exists at least one other path associated with this same functional link and which passes through the other node. This other network path is then referred to as being symmetrical with the first.

Figure 3:
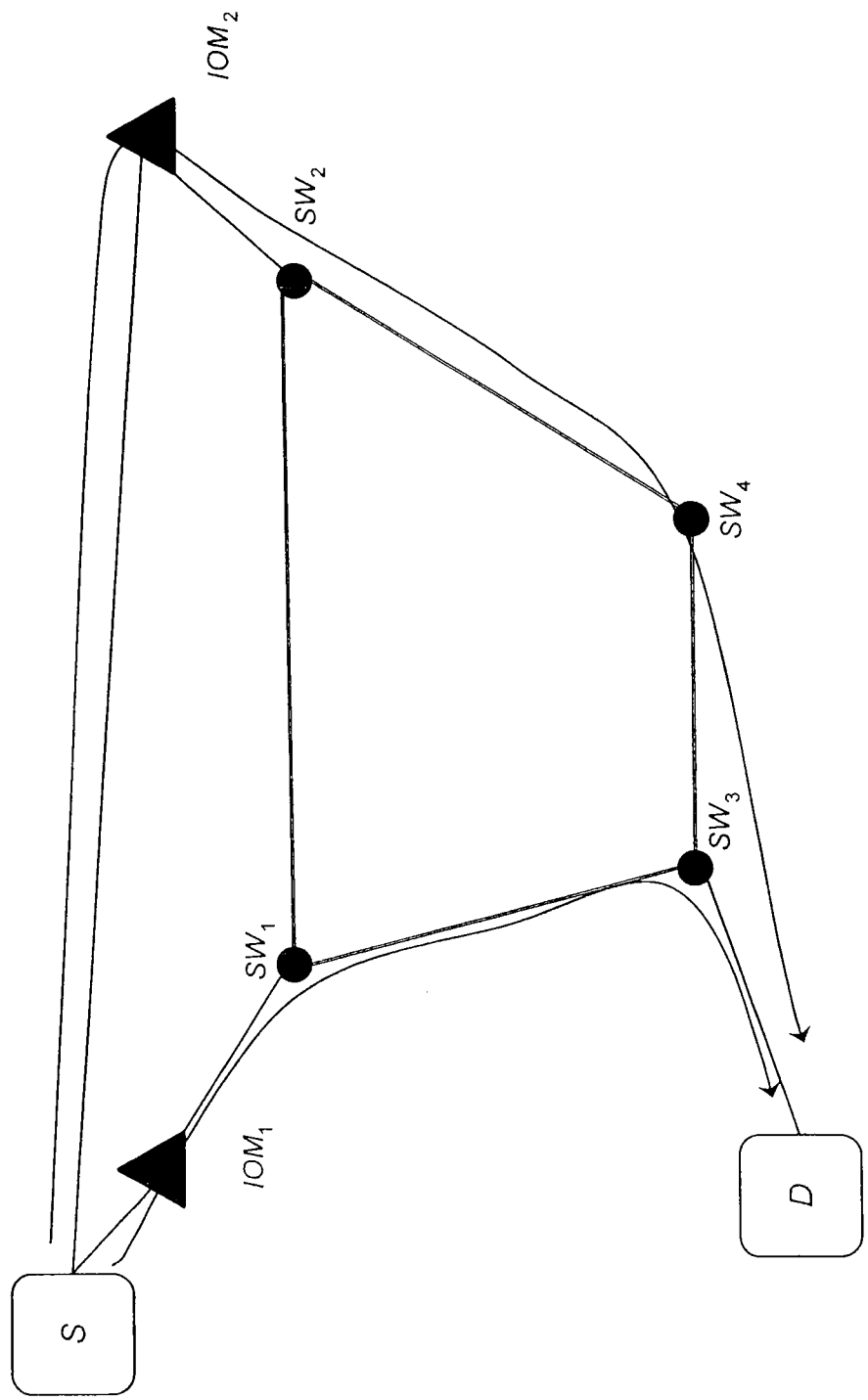
FIG. 3 is a schematic representation of network nodes linked by a symmetry relationship.

FIG. 3 schematically represents the situation involving two symmetrical network nodes. A first path P links a source terminal S to a destination terminal D whilst passing through nodes $10M_1$, $SW_1$, $SW_2$. Nodes $10M_1$ and $10M_2$ are symmetrical to each other: there exist several paths passing through $10M_2$ which can be used to link S and D, for example $10M_2$, $SW_2$. $SW_1$, $SW_3$ and $10M_2$, $SW_2$, $SW_4$, $SW_2$.

The following constants are introduced in order to model this symmetrical relationship:

pathSymTab[p]: table which associates with the network path p of pathTab a set of symmetric network paths p of pathTab. If p does not pass through any communication node which has a symmetric, the set pathSymTab[p] is empty.

pathSymMir[p]: is equal to 1 if the network path p passes through a node which has a symmetric, and is otherwise 0.

The symmetry relationship is therefore expressed by the constraint:

Constraint 7:

$$froPath[fro, p] + pathSymMir[p] \leq 1 + \sum_{pSym \in pathSymTab[p]} froPath[fro, Psym] \quad (8)$$

A node which exhibits a symmetric in the above sense will be referred to in what follows as a mirror type node.

Hosting of Software Modules:

The placement of software module instances fo in terminals ceo will be considered below.

This placement operation involves seeking, for each instance of software module fo, one and only one terminal ceo capable of hosting it. On the other hand, a ceo terminal can host several software module instances.

It will be recalled that a terminal ceo cannot host a fo software module instance if ceo does not belong to the set fo.CpuRes.

In order to model this placement operation, the following decision variables are introduced:

foMap[fo,ceo] which is equal to 1 if the element fo of foTab is hosted by the terminal ceo of ceoTab and 0 otherwise, and the following constraints are defined:

Constraint 8:

$$\forall\, fo \in foTab, \quad \sum_{\substack{ceo \in ceoTab \\ ceo \notin fo \cdot cpuRes}} foMap[fo, ceo] = 0 \tag{9}$$

Constraint 9:

$$\forall\, fo \in foTab, \quad \sum_{\substack{ceo \in foTab \\ ceo \in fo \cdot cpuRes}} foMap[fo, ceo] = 1 \tag{10}$$

Furthermore the associations between the equipment instances and the power sources must be modelled. In effect, at least one power source must be associated with each equipment instance, whether it is a terminal or a communications node, in order for it to be supplied. The associations of power sources with communication nodes are constants. On the other hand, the associations of power sources with the terminals are decision variables. If a ceo terminal is connected to a neo communications node which is of the multiple type, then ceo cannot be associated with a power source other then a power source associated with neo or its duplicated meo. On the other hand, if a ceo terminal is connected to a neo communications node that is not of the multiple type, then ceo must be associated with one of the power sources associated with neo.

The association of a power source with an equipment instance may be modelled by defining the following constants:

neoNrj[neo,nrj] (deduced from the table neoTab) which is equal to 1 if the element neo of neoTab is associated with the element nrj of nrjTab and is otherwise 0;

meoNrj[meo,nrj] (deduced from the table mirEoTab) which is equal to 1 if the element meo of mirEoTab is associated with the element nrj of nrjTab and is otherwise 0;

and the following decision variables are introduced:

ceoNrj[ceo,nrj] which is equal to 1 if the element nrj of nrjTab is associated with the element ceo of ceoTab, and is otherwise 0;

ceoIsCon[ceo] which is equal to 1 if the element ceo of ceoTab is connected to an element neo of neoTab, and is 0 otherwise;

Thus the following constraints are defined in order to model the association:

Constraint 10:

$\forall ceo \in ceoTab$ constraint (iv) is applied (see Appendix, Theorem II), where:

$$d_1 = \sum_{neo \in neoTab} ceoCon[ceo, neo] \tag{11-1}$$

$$d_2 = ceoIsCon[ceo] \tag{11-2}$$

and max $(d_1) = $ Card $(neoTab) + 1$

Constraint 11:

$$\forall\, ceo \in ceoTab,\ \forall\, nrj \in nrjTab, \tag{12}$$

$$ceoNrj[ceo, nrj] \leq 1 - ceoIsCon[ceo] +$$

$$\left( \sum_{neo \in neoTab} ceoCon[ceo, neo] \times neoNrj[neo, nrj] \right) +$$

$$\left( \sum_{\substack{neo \in neoTab \\ meo \in miroTab \\ meo \cdot neo = neo}} ceoCon[ceo, neo] \times meoNrj[meo, nrj] \right)$$

Constraint 12:

$$\forall\, ceo \in ceoTab, \tag{13}$$

$$\sum_{nrj \in nrjTab} ceoNrj[ceo, nrj] \geq 1$$

Constraints of a Functional Origin:

The purpose of constraints 1 to 12 is to model, on the one hand, the association between the functional link instances and possible topological paths, and on the other hand the association between software module instances and equipment instances. The constraints of a functional origin imposed by the paths, hereafter referred to as functional constraints, will now be described.

A first type of functional constraint is constraint of co-location of functional link instances. It involves specifying that the network paths associated with multiple functional link instances must use exactly the same list of communication nodes. Thus dispersion of network paths for multiple functional link instances is avoided, and straight breakdowns are obtained in the sense that the co-located functional links are lost simultaneously.

The following constant is defined in order to model this co-location constraint:

froColTab: set of co-location constraints for functional link instances. Each element froCol of froColTab has an attribute frol, a list of functional link instances subjected to a given co-location constraint;

and the following decision variable is introduced:

froPathEo[fro.neo] which is equal to 1 if the functional link instance fro is associated with a path passing through the neo communication node, and is otherwise 0.

The co-location constraint may then be expressed by the following set of constraints on the decision variables:

Constraint 13:

$\forall fro \in froTab, \forall neo \in neoTab$ the constraint (iv) is applied (see Appendix, Theorem II), where:

$$d_1 = \sum_{p \in pathTab} froPath[fro, p] \times pathEo[p, neo] \quad (14\text{-}1)$$

$$d_2 = froPathEo[fro, neo] \quad (14\text{-}2)$$

and max $(d_1)$ = Card $(pathTab) + 1$

Constraint 14:

∀froCol∈froColTab,∀fro1,fro2∈froCol.frol such that fro1≠fro2

∀neo∈neoTab froPathEo[fro1,neo]=froPathEo[fro2,neo]  (15)

Instead of specifying a co-location constraint, it may conversely prove necessary to make multiple functional link occurrences pass through network paths that use distinct communication nodes. In this way it is ensured that the failure of a communications node will only have an impact on one at most of the functional link instances.

The following constant is defined in order to model this constraint:
froSegTab: set of segregation constraints for functional link instances. Each element froSeg of froSegTab is defined with the attribute frol which gives the list of functional link instances to be segregated.

The segregation constraint can then be expressed in the following form:
Constraint 15:

$$\forall \, froSeg \in froSegTab, \, \forall \, neo \in neoTab, \quad (16)$$
$$\sum_{fro \in froSeg \cdot frol} froPathEo[fro, neo] \leq 1$$

The placement of software module instances on equipment instances may also be subject to constraints of a functional origin. For example, it may be pertinent to arrange for two software module instances to be placed in terminals which must be identical (co-location constraint) or, conversely, distinct (segregation constraint). This second case is justified by the fact that a failure in a generic computer will not simultaneously affect the execution of these two modules. In other types of situations, it may be pertinent to place two software module instances in symmetrical terminals or, conversely, in non-symmetrical terminals. Finally, it may also prove beneficial to place the two software module instances on the same side of an aircraft or, conversely, on opposite sides.

Let any two software module occurrences whatsoever be fo1 and fo2, hosted respectively on two terminals ceo1 and ceo2. A constant is defined for each type of aforementioned constraint:
foCstTypeTab: set of constraints relating to the type of constraint in question. Each element foCstType of foCstTypeTab has an attribute fol, a list of software module instances affected by the constraint.

The co-location constraint implies that the terminals eo1 and eo2 are identical. It may be expressed as:
Constraint 16:

∀foCstType∈foCstTypeTab

∀fo1,fo2∈foCstType.fol such that fo1≠fo2

∀ceo∈ceoTab froMap[fo1,ceo]=froMap[fo2.ceo]  (17)

The segregation constraint implies that the terminals eo1 and eo2 are distinct. It may be expressed as:
Constraint 17:

$$\forall \, foCstType \in foCstTypeTab, \quad (18)$$
$$\forall \, ceo \in ceoTab$$
$$\sum_{fo \in foCstTyp \cdot fol} foMap[fo, ceo] \leq 1$$

The placement constraint on symmetric nodes means that the terminals ceo1 and ceo2 must be symmetrical in the sense that they are linked by the attribute symId.
Constraint 18:

∀foCstType E foCstTypeTab,

∀fo1,fo2∈foCstType.fol such that fo1≠fo2

∀ceo1,ceo2∈ceoTab such that ceo2=ceo1.symId foMap[fo1,ceo1]=foMap[fo2,ceo2]  (19)

Conversely, however, the placement constraint on non-symmetric nodes means that the terminals ceo1 and ceo2 are not symmetrical, that is:
Constraint 19:

foCstType∈foCstTypeTab,

∀fo1,fo2∈foCsType.fol such that fo1≠fo2

∀ceo1,ceo2∈ceoTab such that ceo2=ceo1.symId foMap[fo1,ceo1]+foMop[fo2,ceo2]≤1  (20)

The placement constraints for software module instances on the same side s of the aircraft, also called the laterality constraint, may be formalised by introducing the decision variable:
foMapSide[fo,s] which is equal to 1 the element fo of foTab is located on a terminal ceo of ceoTab associated with the side s of the aircraft, and is 0 otherwise.

The laterality constraint is expressed by the following set of two constraints:
Constraint 20:

$$\forall \, fo \in foTab \quad (21)$$
$$\forall \, s \in sideTab$$
$$foMapSide[fo, s] = \sum_{\substack{ceo \in ceoTab \\ ceo \cdot side = s}} foMap[fo, ceo]$$

Constraint 21:

∀foCstType∈foCstTypeTab

∀fo1,fo2∈foCstType.fol such that fo1≠fo2

∀s∈sideTab foMapSide[fo1,s]=foMapSide[fo2,s]  (22)

Conversely, for a bi-laterality constraint, that is, if the software module instances must be located on opposite sides of the aircraft, the following constraint must be observed:
Constraint 22:

$$\forall \, foCstType \in foCstTypeTab \qquad (23)$$
$$\forall \, s \in sideTab$$
$$\sum_{fo \in foCstTyp \cdot fol} foMapSide[fo, s] \leq 1$$

It may also be of benefit to specify that two terminals hosting two software module instances must be supplied by the same power source or, conversely, must be supplied by separate power sources. The second case prevents a supply fault in one source simultaneously affecting the execution of both software module instances.

To this end the following decision variables are defined:
foNrjCeo[fo, nrj, ceo] which is equal to 1 if the element nrj of nrjTab is associated with terminal ceo of ceoTab and the software module fo of foTab is located on ceo, and is 0 otherwise;
foNrj[fo, nrj] which is equal to 1 if the software module fo of foTab is placed on a terminal of ceoTab which is associated with an element nrj of nrjTab, and is 0 otherwise.

Let fo1 and fo2 be any two software module instances whatsoever; ceo1 and ceo2 which respectively host fo1 and fo2 could be made to be supplied by the same power source by ensuring the following three constraints are met:
Constraint 23:

∀ceo∈ceoTab

∀fo∈foTab

∀nrj∈nrjTab constraint (viii) is applied (see Appendix, Theorem IV) where:

$$d_1 = ceoNrj[ceo,nrj] \qquad (24\text{-}1)$$
$$d_2 = foMap[fo,ceo] \qquad (24\text{-}2)$$
and $d_3 = foNrj[fo,nrj,ceo]$ (24-3)

Constraint 24:

∀fo∈foTab

∀nrj∈nrjTab the constraint (iv) is applied (see Appendix, Theorem II), where:

$$d_1 = \sum_{ceo \in ceoTab} foNrjCeo[fo, nrj, ceo] \qquad (25\text{-}1)$$
$$d_2 = foNrj[fo, nrj]$$
and max $(d_1)$ = Card $(ceoTab)$ + 1 (25-2)

Constraint 25:

∀foCstType∈foCstTypeTab

∀fo1,fo2∈foCstType.fol such that fo1≠fo2

∀nrj∈nrjTab foNrj[fo1,nrj]=foNrj[fo2,nrj]  (26)

Conversely, requiring that two terminals ceo1 and ceo2, which respectively host two distinct software modules fo1 and fo2, be supplied by distinct power sources amounts to observing the following constraint:
Constraint 26:

$$\forall \, foCstType \in foCstTypeTab, \qquad (27)$$
$$\forall \, nrj \in nrjTab,$$
$$\sum_{fo \in foCstType \cdot fol} foNrj[fo, nrj] \leq 1$$

Another functional constraint aims at placing two software modules instances on the same terminal or, conversely, on two distinct terminals.

The constraint of co-location on the same terminal is expressed as:
Constraint 27:

$$\forall \, foCstType \in foCstTypeTab, \qquad (28)$$
$$\forall \, fo1, fo2 \in foCstType \cdot fol \text{ such that } fo1 \neq fo2$$
$$\forall \, ce \in ceTab$$
$$\sum_{ceo \in cecos} foMap[fo1, ceo] = \sum_{ceo \in cecos} foMap[fo2, ceo]$$

The constraint for segregation of software module instances in terms of terminals may, conversely, be expressed as:
Constraint 28:

$$\forall \, foCstType \in foCstTypeTab \qquad (29)$$
$$\forall \, ce \in ceTab$$
$$\sum_{\substack{fo \in foCstType \cdot fol \\ ceo \in ce \cdot cos}} foMap[fo, ceo] \leq 1$$

Having reviewed the functional constraints which can be imposed on network paths and on terminals, it remains to consider the functional constraints which can affect the links between terminals and communication nodes.

Let neo11 be the set of nodes of neoTab to which ceo1 is connected, and neo12 the set of elements of neoTab to which ceo2 is connected.

The following constant is defined locally at each type of constraint:
foCstTypeTab: set of constraints relating to the type of constraint in question. Each element foCstType of foCstTypeTab has an attribute fol, a list of software module instances affected by this constraint.

As before, co-location and segregation constraints, symmetry and asymmetry constraints, laterality and bi-laterality constraints can be distinguished.

The co-location constraint requires that sets of nodes neo11 and neo12 be identical, that is:
Constraint 29:

∀foCstType∈foCstTypeTab,

∀fo1,fo2∈foCstType.fol such that fo1≠fo2

∀neo∈neoTab foCon[fo1,neo]=foCon[fo2,neo]  (30)

The segregation constraint requires that sets of nodes neo11 and neo12 be disjoint, that is:
Constraint 30:

$$\forall\, foCstType \in foCstTypeTab, \quad (31)$$
$$\forall\, neo \in neoTab$$
$$\sum_{fo \in foCstType.fol} foCon[fo, neo] \le 1$$

The symmetry constraint for connection nodes implies that for all nodes of neo11, its symmetric is in neo12 and vice versa. This assumes, furthermore, that all the nodes of neo11 and neo12 have a symmetric, that is:
Constraint 31:

∀foCstType∈foCstTypeTab

∀fo∈foCstType.fol

∀neo∈neoTab such that neo.symId is not defined:

foCon[fo,neo]=0 (32)

and, in order to express the symmetry of nodes on neo11 and neo12:
Constraint 32:

∀foCstType∈foCstTypeTab,

∀fo1,fo2∈foCstType.fol such that fo1≠fo2

∀neo1,neo2∈neoTab such that neo2=neo1.symId foCon[fo1,neo1]=foCon[fo2,neo2] (33)

The asymmetry constraint for connection nodes assumes as previously that each node of neo11 and neo12 has a symmetric; in other words, that constraint 32 is observed and on the other hand that any symmetric of a node of neo11 does not belong to neo12, and vice versa, that is:
Constraint 33:

∀foCstType∈foCstTypeTab

∀fo1,fo2∈foCstType.fol such that, fo1≠fo2

∀neo1,neo2∈neoTab such that neo2=neo1.symId foCon[fo1,neo1]+foCon[fo2,neo2]≤1 (34)

The laterality constraint of connection nodes implies that:
all elements of neo1 (respectively neo12) are associated with the same side of an aircraft s1 (respectively s2)
sides s1 and s2 are identical
Constraint 34:

∀fo∈foTab

∀s∈sideTab the constraint (iv) is applied (see Appendix, Theorem II), where:

$$d_1 = \sum_{\substack{neo \in neoTab \\ neo.side=s}} foCon[fo, neo] \quad (35\text{-}1)$$

$$d_2 = foConSide[fo, s] \quad (35\text{-}2)$$
and max $(d_1)$ = Card $(neoTab) + 1$ Constraint 35:

$$\forall\, foCstType \in foCstTypeTab \quad (36)$$
$$\forall\, fo \in foCstType \cdot fol$$
$$\sum_{s \in sideTab} foConSide[fo, s] \le 1$$

Constraint 36:

∀foCstType∈foCstTypeTab

∀fo1,fo2∈foCstType.fol such that fo1≠fo2

∀s∈sideTab foConSide[fo1,s]=foConSide[fo2,s] (37)

The bi-laterality constraint of connection nodes implies that:
all elements of neo11 (respectively neo12) are associated with the same side of an aircraft s1 (respectively s2)
sides s1 and s2 are different
The modelling of this constraint uses, on the one hand, constraint 35 given above (which indicates that all nodes connected to a software module instance fo are on the same side), as well as the specific constraint:
Constraint 37:

$$\forall\, foCstType \in foCstTypeTab, \quad (38)$$
$$\forall\, s \in sideTab$$
$$\sum_{fo \in foCstType \cdot fol} foConSide[fo, s] \le 1$$

We will consider below a last type of constraint which allows certain choices to be set, for example, forcing a given functional link instance to pass through such and such a direct or indirect topological path, or that a given software module instance be hosted by such and such a terminal. The benefit of imposing such constraints is that implementation options can be set which have already been validated by experience or that re-examination of a portion that has already been implemented can be avoided. For example, if an avionics platform that has already been created is the subject of subsequent development, it may be judicious not to re-consider any or some part of the implementation.

First of all the fixed choice constraints relating to functional link instances will be considered. To this end the following decision constant is defined:
fixFroPathTab: set of constraints which allows a choice of placement of a functional link instance on a topological path (direct or indirect) to be imposed. Each element fixFroPath of fixFroPathTab is defined with attributes:
fro: reference of the functional link instance of froTab whose placement one wishes to impose;
p: indirect path that it wished to impose on fro. This field may not de defined if the choice of path is not fixed:
direct: is equal to 1 if a direct path is imposed on fro, 0 if an indirect path is imposed.
The following constraints are imposed in order to impose a choice of functional link routing:
Constraint 38:

∀fixFroPath∈fixFroPathTab such that fixFroPath.p is defined froPath[fixFroPath.fro,fixFroPath.p]=1 (39)

Constraint 39:

$$\forall \text{fixFroPath} \in \text{fixFroPathTab} \text{ such that fixFroPath.direct}=1$$

$$\text{froDirect}[\text{fixFroPath.fro}]=1 \quad (40)$$

The choice of placement of software module instances in certain predetermined terminals can also be imposed. To do this the following decision constant is defined:

fixFoCeoTab: set of constraints which allows a choice of placement of a software module instance on a terminal to be imposed. Each element fixFoCeo of fixFoCeoTab has the following attributes:
- fo: reference to element of foTab whose placement one wishes to impose;
- ceo: reference to element of ceoTab on which one wishes to impose the placement of fo. This field may not de defined if the choice of path is not fixed;
- side: reference to an element of sideTab. This reference indicates that the terminal ceo onto which one wishes to place the software module occurrence fo is associated with this side. This field may not de defined if the choice of side is not fixed.

The imposition of the choice of software module instance placement is achieved by means of the following constraints:

Constraint 40:

$$\forall \text{fixFoCeo} \in \text{fixFoCeoTab} \text{ such that the field ceo is defined}$$

$$\text{foMap}[\text{fixFoCeo.fo},\text{fixFoCeo.ceo}]=1 \quad (41)$$

Constraint 41:

$$\forall \text{fixFoCeo} \in \text{fixFoCeoTab} \text{ such that the field side is defined}$$

$$\text{foMapSide}[\text{fixFoCeo.fo},\text{fixFoCeo.side}]=1 \quad (42)$$

The choice of connections between a terminal hosting a software module instance and one or more communication nodes can also be set. More specifically, let fo be a software module instance of foTab and neo an element of neoTab. It is said that fo is connected to neo if a terminal ceo of ceoTab exists such that fo is placed on ceo and ceo is connected to neo.

A level of connection is associated with each communication node, using the attribute conLevel in neoTab (see above). This attribute is used to distinguish, for example, switches in the AFDX network, AFDX hubs (or micro-commutators) or gateways. The following constraints are therefore defined:

fixCeoNeoTab: set of constraints which allow a terminal's connection to a communication node to be set. Each element fixCeoNeo of FixCeoNeoTab is defined with the following attributes:
- ceo: reference to the element of foTab to which it is wished to fix the connection;
- neo: reference to the element of neoTab to which it is wished to fix the connection;
- flag: equal to 1 if one wishes to require that ceo and neo be connected, 0 if one wishes to require that ceo and neo are not connected:

fixFoNeoSideTab: set of constraints which allow the connection of a software module instance to a communication node associated with a given side to be imposed. Each element fixFoNeoSide of fixFoNeoSideTab is defined with the following attributes:
- fo: reference to the element of foTab under consideration.
- side: reference to the element of sideTab under consideration.

foConLevelMaxTab: set of constraints which allows a maximum number of connections to be set between a software module instance and communication nodes which have a given connection level. Each element of foConLevelMax of foConLevelMaxTab is defined with the following attributes:
- fo: reference to the element of foTab under consideration
- conLevel: connection level under consideration
- conMax: maximum number of connections between fo and communication nodes ceo which have a connection level conLevel.

The imposition of connections to communication nodes is then achieved using the following four constraints:

Constraint 42:

$$\forall \text{fixCeoNeo} \in \text{fixCeoNeoTab} \text{ such that fixCeoNeo.flag}=1$$

$$\text{ceoCon}[\text{fixCeoNeo.ceo},\text{fixCeoNeo.neo}]=1 \quad (43)$$

Constraint 43:

$$\forall \text{fixCeoNeo} \in \text{fixCeoNeoTab} \text{ such that fixCeoNeo.flag}=0$$

$$\text{ceoCon}[\text{fixCeoNeo.ceo},\text{fixCeoNeo.neo}]=0 \quad (44)$$

Constraint 44:

$$\forall \text{fixFoNeoSide} \in \text{fixFoNeoSideTab}$$

$$\text{foConSide}[\text{fixFoNeoSide.fo},\text{fixFoNeoSide.side}]=1 \quad (45)$$

Constraint 45:

$$\forall\, foConLevelMax \in foConLevelMaxTab \quad (46)$$

$$\sum_{\substack{neo \in neoTab \\ neo.conLevel = foConLevelMax.conLevel}} foCon[foConLevelMax \cdot fo, neo] \leq foConLevelMax \cdot conMax$$

Finally it could be that it is wished to force certain equipment to be supplied by such and such a power source. To this end, the following decision constant is defined:

fixCeoNrjTab: set of constraints which allow the association of a terminal with a power source to be set. Each element fixCeoNrj of fixCeoNrjTab has the following attributes:
- ceo: reference to the terminal of ceoTab concerned;
- nrj: reference to the power source of nrjTab concerned;
- flag: equal to 1 if one wishes to require that nrj powers ceo, 0 if one wishes to require that nrj does not power it:

Imposition of the supply to the equipment in question is expressed using the following constraints;

Constraint 46:

$$\forall \text{fixCeoNrj} \in \text{fixCeoNrjTab} \text{ such that fixCeoNrj.flag}=1$$

$$\text{ceoNrj}[\text{fixCeoNrj.ceo},\text{fixCeoNrj.nrj}]=1 \quad (47)$$

Constraint 47:

$$\forall \text{fixCeoNrj} \in \text{fixCeoNrjTab} \text{ such that fixCeoNrj.flag}=0$$

$$\text{ceoNrj}[\text{fixCeoNrj.ceo},\text{fixCeoNrj.nrj}]=0 \quad (48)$$

It has been seen in this first part how conditions for software module equipment implementation and functional link instances in the avionics platform can be expressed in the form of constraints, on the decision variables.

The optimisation of the implementation whilst meeting these constraints, or only of some of them, is achieved by minimising a certain number of cost functions which are expressed as linear combinations of the decision variables already introduced, or of new decision variables which will be introduced below.

The optimisation criteria and their associated cost functions will be described in this second part.

It is important to note that these cost functions may be minimised conjointly or successively. For example, the minimisation of a first cost function may provide a set of possible implementation solutions. The minimisation of a second function from this first set of costs provides a sub-set of this first sub-set.

A first optimisation criterion involves minimising the number of terminals that are connected to several communication nodes. In other words, as great a reduction as possible in the number of multiple connections of terminals to network(s) is sought.

This first optimisation criterion is expressed as the following cost function minimisation:
Cost Function 1:

$$CF_1 = \sum_{ceo \in ceoTab} \left[ \sum_{neo \in neoTab} ceoCon[ceo, neo] \right) - ceoIsCib[ceo] \right] \quad (49)$$

A second optimisation criterion involves using communication nodes with low connection levels as a priority wherever this is possible. For example, for a terminal capable of communicating with an AFDX switch and with a gateway, the connection to the switch may be preferred. Similarly for a terminal capable of communicating with an AFDX hub (micro-commutator) and a switch, the connection to the micro-commutator should be preferred. The assumption is that the gateway is assigned a greater connection level than that for the AFDX switch, which is itself greater than that of the AFDX micro-commutator.

This second optimisation criterion is expressed as the following cost function minimisation:
Cost Function 2:

$$CF_2 = \sum_{ceo \in ceoTab} \sum_{neo \in neoTab} ceoCon[ceo, neo] \times neo \cdot conLevel \quad (50)$$

A third optimisation criterion involves the minimisation, for a given type of equipment, that is, for an element ne of neTab, of the number of connections associated with any instance neo of ne.
The following decision variable is introduced:
neConMax[ne]: for the element ne of neTab, is equal to the maximum number of connections reached by one of the elements ne.neos. By definition, this decision variable should verify the following constraint:
Constraint 48:

$$\forall ne \in neTab \quad (51)$$

$$\forall neo \in ne \cdot neos$$

$$neConMax[ne] \geq neo \cdot conNb + \sum_{ceo \in ceoTab} ceoCon[ceo, neo]$$

The optimisation of this third criterion amounts to minimising the following cost function:
Cost Function 3:

$$CF_3 = \sum_{ne \in neTab} neConMax[ne] \quad (52)$$

A fourth optimisation criterion involves connecting a terminal ceo of ceoTab to the communication node neo that is the closest to it in terms of actual distance. To do this the following decision constant is defined:
ceoNeoCost[ceo,neo]: gives the cost (value proportional to the actual distance) associated with the connection of the terminal ceo of ceoTab to the node neo of neoTab.

The optimisation of this fourth criterion amounts to minimising the following cost function:
Cost Function 4:

$$CF_4 = \sum_{ceo \in ceoTab} \sum_{neo \in neoTab} ceoCon[ceo, neo] \times ceoNeoCost[ceo, neo] \quad (53)$$

A fifth optimisation criterion involves minimising the number of power sources associated with a given terminal. Multiplication of power supply lines is therefore avoided, with only those necessary for the independent execution of software module instances hosted by the terminals being retained.

The optimisation of this criterion amounts to minimising the following cost function:
Cost Function 5:

$$CF_5 = \sum_{ceo \in ceoTab} \sum_{nrj \in nrjTab} ceoNrj[ceo, nrj] \quad (54)$$

A sixth optimisation criterion involves the optimisation of the resource requirements of the various terminals. More specifically, this criterion is used, for a terminal type ce of ceTab, for the minimisation of the maximum equipment resource requirements (CPU calculation power, ROM size, size of RAM, size of NVME (non-volatile memory e.g. hard disk)) that a terminal ceo of type ce has need of (ceo is an instance of ce).

In order to do this, the following decision variables are introduced:
ceoResCostType[ceo,resType]: gives, for each type of resource resType (CPU, RAM, ROM, NVME etc.), the total amount of this type of resource used by the software modules hosted by ceo;
ceCostMax[ce]: gives, for the type of terminal ce, the maximum (as percentage) of resources used by one of the terminals of this type ce.ceos;
The following constraints are defined:
Constraint 49:

$$\forall ceo \in ceoTab \quad (55)$$

$$\forall resType \in resTypeTab$$

$$ceoResTypeCost[ceo, resType] =$$

-continued
$$\sum_{fo \in foTab} foMap[fo, ceo] \times fo \cdot resTypeCost[resType]$$

Constraint 50:

$\forall ce \in ceTab$ (56)

$\forall ceo \in ce \cdot ceos$ $\forall resType \in resTypeTab$ $$ceCostMax[ce] \geq 100 \times \frac{ceoResTypeCost[ceo, resType]}{ce \cdot resTypeQtt[resType]}$$

The optimisation of the sixth criterion amounts to minimising the following cost function:
Cost Function 6:

$$CF_6 = \sum_{ceo \in ceTab} ceCostMax[ce] \quad (57)$$

It can also be specified that the terminals of various types may only use at most a percentage η% of their respective resources; in other words:
Constraint 51:

∀ce∈ceTab $ceCostMax[ce] \leq \eta$ (58)

One important specific case corresponds to η=100%, that is, that the software modules hosted by a terminal of a given type may not use more than the total amount of resources that this terminal has available.

A seventh criterion aims at minimising the number of functional links implemented by the direct topological paths between terminals. In effect, it is generally preferable to pass through network paths in order to reduce the number of direct links.

The optimisation of this criterion amounts to minimising the following cost function:
Cost Function 7:

$$CF_7 = \sum_{fro \in froTab} froDirect[fro] \quad (59)$$

An eighth criterion involves minimising the number of topological paths associated with a given functional link.
The optimisation of this criterion amounts to minimising the following cost function:
Cost Function 8:

$$CF_8 = \sum_{\substack{fro \in froTab \\ p \in pathTab}} froPath[fro \cdot p] \quad (60)$$

A ninth optimisation criterion involves minimising the topological length of indirect paths associated with a functional link. The topological length of a path (indirect) is defined as the number of communication nodes that this path passes through.

The optimisation of this criterion amounts to minimising the following cost function:
Cost Function 9:

$$CF_9 = \sum_{\substack{fro \in froTab \\ p \in pathTab}} froPath[fro \cdot p] \times \text{card}(p) \quad (61)$$

A tenth optimisation criterion involves minimising the number of common communication nodes between several indirect topological paths associated with a given functional link. In order to do this, the following decision variables are introduced:
neoNbPerFro[fro,neo] equal to the number of paths associated with the functional link fro of froTab, passing through the node neo of neoTab;
neoComInFro[fro,neo] equal to 1 if the node neo of neoTab is common to at least two paths associated with the functional link fro of froTab.
and the following constraints are defined:
Constraint 52:

$\forall fro \in froTab$ (62)

$\forall neo \in neoTab$ $$neoNbPerFro[fro, neo] = \sum_{\substack{fro \in froTab \\ p \in pathTab}} froPath[fro, p] \times pathEo[p, neo])$$

Constraint 53:

∀fro∈froTab

∀neo∈neoTab constraint (ii) is applied (see Appendix Theorem I) where:

$c1 = neoNbPerFro[fro,neo]$ $d2 = 1$ $d1 = neoComInFro[fro,neo]$ $M = \text{card}(pathTab) + 1$ (63)

The optimisation of this criterion amounts to minimising the following cost function:
Cost Function 10:

$$CF_{10} = \sum_{\substack{fro \in froTab \\ p \in pathTab}} neoComInFro[fro, neo] \quad (64)$$

An eleventh optimisation criterion involves minimising the number of common communication nodes between several instances fro of a given functional link fr.
The following decision variables are introduced:
neoNbPerFr[fr,neo]: equal to the number of instances of the element fr of frTab passing through the element neo of neoTab;

neoComInFr[fr,neo]: equal to 1 if the node neo of neoTab is common to at least two associated instances of the element fr of frTab;
and the following constraints are defined:
Constraint 54:

$$\forall\, fr \in frTab \quad (65)$$
$$\forall\, neo \in neoTab$$
$$neoNbPerFr[fr, neo] = \sum_{fro \in fr.fros} froPathEo[fro, neo]$$

Constraint 55:
∀fro E froTab
∀neo E neoTab
constraint (ii) is applied (see Appendix Theorem I) where:

$$c1 = neoNbPerFr[fr,neo]$$
$$d2 = 1$$
$$d1 = neoComInFr[fr,neo]$$
$$M = card(froTab)+1 \quad (66)$$

The optimisation of this criterion amounts to minimising the following cost function:
Cost Function 11:

$$CF_{11} = \sum_{\substack{fr \in frTab \\ neo \in neoTab}} neoComInFr[fr, neo] \quad (67)$$

A twelfth optimisation criterion involves minimising the total number of communication nodes used by a functional link. In order to do this, the following decision variable is introduced: frNeo[fr,neo] which is equal to 1 if the element fr of frTab has at least one of its instances associated with a path which passes through the node neo of neoTab.
The following constraint is therefore defined:
Constraint 56:

∀fr∈feral)

∀neo∈neoTab the constraint (iv) is applied (see Appendix, Theorem II), where:

$$d1 = \sum_{fro \in fr.fros} froPathEo[fro, neo] \quad (68)$$
$$d2 = frNeo[fr, neo]$$
$$\max\_d1 = card\,(foTab)$$

The optimisation of this criterion amounts to minimising the following cost function:
Cost Function 12:

$$CF_{12} = \sum_{\substack{fr \in frTab \\ neo \in neoTab}} frNeo[fr, neo] \quad (69)$$

Finally, a thirteenth optimisation criterion involves preferring indirect topological paths associated with an instance of a functional link which links a source software module and a destination software module hosted on terminals located on different sides of the aircraft, which carry out a change of sides as late as possible. Thus these paths remain for as long as possible on the side of the aircraft where the source software module is hosted.

The optimisation of this criterion amounts to minimising the following cost function:
Cost Function 13:

$$CF_{12} = \sum_{\substack{fro \in froTab \\ p \in pathTab \\ neo \in \{p|neo\text{-}side \neq first(p)\text{-}side\}}} froPath[fro, p] \quad (70)$$

The skilled in the art will understand that other optimisation criteria and therefore other cost functions may be envisaged whilst still remaining within the context of the invention.

Figure 4:
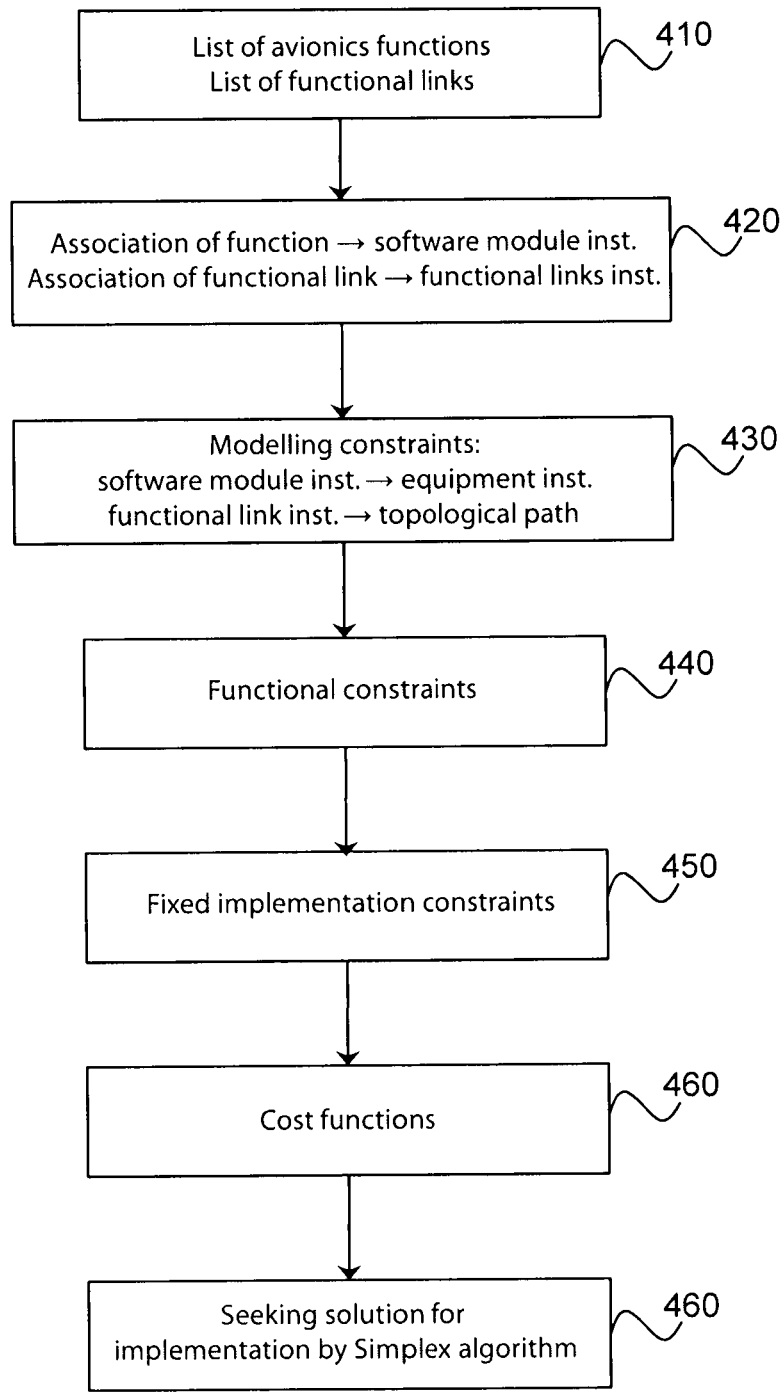
FIG. 4 is a schematic representation of the method for optimisation of an avionics platform according to one embodiment of the invention.

FIG. 4 illustrates the method for optimisation of the implementation an avionics platform according to one embodiment of the invention.

In a first step 410, the avionics functions and the functional links between these functions are listed.

In a second step 420, each function is made to correspond to one or more software modules (software module instances) allowing said function to be carried out. Similarly, multiple instances embodying this link are made to correspond to each functional link.

In a third step 430, the association between functional link instances and topological paths are modelled using a first set of constraints (see constraints 1-6), if necessary by taking into account certain simplifying rules of symmetry and of duplication. In the same manner, the association between the software modules and the equipment instances (terminals) is modelled using a second set of constraints (constraints 8-12). The second set of constraints may also allow one or more power sources to be associated with each equipment instance (see constraints 10-12).

In a fourth step 440, a third set of constraints called functional constraints are specified (constraints 13-37), generally co-location constraints or segregation constraints dealing with instances of functional links (using identical or disjoint network paths) and software module instances (hosted by sets of identical or disjoint terminals, themselves supplied by sets of identical or disjoint power sources). Other functional constraints may be envisaged for certain nodes (laterality/bilaterality, symmetry/asymmetry).

In a fifth optional step 450, a fourth set of fixed choice constraints is specified, which allows a part of the implementation to be fixed (constraints 38-47).

The aforementioned constraints (1-47) are expressed in the form of inequalities which involve linear combinations of decision variables.

In a sixth step, 460, criteria which one wishes to optimise (platform implementation optimisation criteria) and corresponding cost functions are listed ($CF_1$ to $CF_{13}$). Some of these cost functions ($CF_2$, $CF_5$, $CF_9$, $CF_{10}$, $CF_{11}$) involve new decision variables which are then subjected to a fifth set of constraints (48; 49-50; 52-53; 54-55; 56), also expressed in the form of linear inequalities.

In a seventh step, 470, the optimum solution or solutions for implementation are sought by using the Simplex algorithm. Optimisation under constraints can be undertaken, as has already been said, either conjointly or successively (cost function by cost function).

In conjoint optimisation, the cost functions are minimised simultaneously over the set of possible values of the decision variables. On the other hand, in successive optimisation only a first cost function is minimised on this set and each of the other functions is minimised on the sub-set of possible values obtained by minimisation of a previous cost function.

In practice, optimisation is carried out using software run by a computer. Once optimisation has been carried out, the platform is implemented according to the/an optimum solution determined at step 470. The implementation step involves providing terminals equipped with resources determined by the optimum solution, storing the software module instances in these terminals and if necessary supplying them from the various power sources. This also involves providing the networks and physical links, either directly between terminals or between terminals and network nodes, and storing routing tables/commutation tables in said nodes in order to implement the network paths.

APPENDIX

Theorem I:
Let there be three decision variables $d_1, c_1, c_2$ such that:

if $c_1 > c_2$ then $d_1 = 1$, otherwise $d_1 = 0$     (i)

This logic relationship may be expressed using the following linear inequality:

$$-(M+1) + d_1(M+1) + 1 \leq c_1 - c_2 \leq -d_1 M \quad (ii)$$

where M is such that $-M \leq c_1 - c_2 \leq M$
Theorem II:
Let there be two decision variables $d_1, d_2$ such that:

if $d_1 > 0$ then $d_2 = 1$, otherwise $d_2 = 0$     (iii)

This logic relationship may be, expressed using the following linear inequalities:

$$d_2 \leq d_1 \text{ and } d_2 M \geq d_1 \quad (iv)$$

where M is such that $M > \max(d_1)$.
Theorem III:
Let there be three decision variables $d_1, d_2, d_3$ such that:

if $d_1 = 1$ then $d_3 = d_2$ if $d_1 = 0$ then $d_3 = 0$     (v)

This logic relationship may be expressed using the following linear inequalities:

$$d_3 - d_2 \geq (d_1 - 1)M \text{ and } d_3 \leq d_2 \text{ and } d_3 \leq M d_1 \quad (vi)$$

where M is such that $M > d_2$.
Theorem IV:
Let there be three decision variables $d_1, d_2, d_3$ such that:

if $d_1 = 1$ and $d_2 = 1$ then $d_3 = 1$, otherwise $d_3 = 0$     (vii)

This logic relationship may be expressed using the following linear inequalities:

$$-d_1 + d_3 \leq 0 \text{ and } -d_2 + d_3 \leq 0 \text{ and } d_1 + d_2 - d_3 \leq 1 \quad (viii)$$

The invention claimed is:

1. A computer-assisted method for for optimization of an aircraft's avionics platform, said method comprising:
    associating functional link instances with paths intended to implement the functional link instances, using a first set of constraints, the functional link instances exchanging messages between software module instances, the software module instances being associated with one of a plurality of avionics functions of the platform, the platform additionally including a plurality of equipment items linked together by unidirectional or bidirectional physical links which belong to different types of networks, paths used to link said plurality of equipment items, where each path is made up either of a single direct physical link between a source equipment item and a destination equipment item, or of a first physical link between said source equipment item and a first network node, a second physical link between said destination equipment item and a second network node, and a network path between said first and second nodes;
    associating software modules instances with at least one of the plurality of equipment items intended to host the software modules instances, using a second set of constraints, where said constraints of the first and the second sets are formulated as linear inequalities of decision variables;
    generating a third set of constraints formulated as linear inequalities of decision variables, the third set of constraints constraining instances of functional links to be segregated using sets of network paths that are disjoint, the third set of constraints including linear inequalities constraining a number of network paths between the source equipment item and the destination equipment item passing through a specific node to be less than a specific number;
    minimizing a plurality of cost functions, each cost function being formulated as a linear combination of at least certain of said decision variables in order to obtain at least one optimum solution for the implementation of the avionics functions in the platform; and
    implementing the plurality of avionics functions in the platform according to the optimum solution such that the software module instances are implemented on the plurality of equipment items and functional links are implemented on paths included in the at least one optimum solution.

2. The computer-assisted method for optimisation, according to claim 1, further comprising:
    associating one or more power sources with each item of equipment using said second set of constraints.

3. The computer-assisted method for optimisation, according to claim 1, further comprising:
    generating, prior to minimisation of the cost functions, the third set of constraints formulated as linear inequalities of decision variables, such that the third set of constraints also constrain instances of functional links to be co-located using sets of network paths that are identical.

4. The computer-assisted method for optimisation, according to claim 3, wherein the third set of constraints constrains software module instances to be co-located or segregated using sets of equipment that are, respectively, identical and disjoint.

5. The computer-assisted method for optimisation, according to claim 3, wherein the third set of constraints constrains software module instances to be required to be hosted by equipment supplied by power sources that are identical or distinct.

6. The computer-assisted method for optimisation, according to claim 1, further comprising:
    generating, prior to minimisation of the cost functions, a fourth set of constraints formulated as linear inequalities of decision variables, which can be used beforehand, to constrain that an instance of a functional link passes through a given network path, or to constrain that an instance of a software module be hosted by a given item of equipment.

7. The computer-assisted method for optimization, according to claim 6, wherein at least one cost function includes an additional decision variable which does not occur in the set of constraints in the first, second, third or fourth sets of constraints, and the method further comprising:
generating a fifth set of constraints in the form of an inequality, which is linearly dependent on at least said additional decision variable.

8. The computer-assisted method for optimisation, according to claim 1 further comprising:
minimising the cost functions conjointly over a set of possible values of said decision variables.

9. The computer-assisted method for optimization, according to claim 1 further comprising: minimizing successively the cost functions with a first cost function being minimized over the set of possible values of said decision variables and where each of the other cost functions are minimized over the sub-set of said values obtained through the previous cost function minimization.

10. The computer-assisted method for optimisation, according to claim 1, wherein said cost functions belong to the following list:
number of items of equipment connected to several communication networks;
weighted combination of the number of communication nodes of various types;
maximum number of communication node connections;
sum of the real distances between the items of equipment and the communications nodes to which they are connected;
number of power sources supplying the various items of equipmentM sum of the maximum levels of utilisation of equipment resources by the software module instances;
number of paths associated with a given functional link;
topological length of network paths associated with a given functional link;
number of communication nodes common to the network paths associated with a given functional link; and
total number of communication nodes used by the network paths associated with a given functional link.

11. A method for the creation of an avionics platform, comprising:
optimising the platform architecture the optimisation method according to claim 1, wherein the implementing of the avionics functions comprises:
equipping terminals of the avionics platform with the resources determined by the optimum solution; and
storing the software module instances in these terminals.

12. The method for creating an avionics platform, according to claim 11, further comprising:
providing network and physical links, either directly between terminals or between terminals and network nodes; and
storing the routing/commutation tables in said nodes in order to implement the network paths determined by said optimum solution.

* * * * *